US005190592A

United States Patent [19]

Chazee

[11] Patent Number: 5,190,592

[45] Date of Patent: Mar. 2, 1993

[54] AEROSOL INJECTION SYSTEM FOR PRODUCING COMPOSITE LAYERS BY PYROLYSIS

[75] Inventor: Jean-Jacques Chazee, Grenoble, France

[73] Assignee: Commissariat a l'Energie Atomique, Paris, France

[21] Appl. No.: 684,371

[22] Filed: Apr. 12, 1991

[30] Foreign Application Priority Data

May 2, 1990 [FR] France ............................... 90 05525

[51] Int. Cl.[5] ............................................. C23C 16/46

[52] U.S. Cl. .................................... 118/719; 118/725; 118/715; 118/726; 118/728

[58] Field of Search ............... 118/715, 725, 726, 728, 118/719

[56] References Cited

FOREIGN PATENT DOCUMENTS 0336574 10/1989 European Pat. Off. .

8403720 12/1984 World Int. Prop. O. .

*Primary Examiner*—Richard Bueker

*Attorney, Agent, or Firm*—Oblon, Spivak, McClelland, Maier & Neustadt

[57] ABSTRACT

System for the injection of a droplet aerosol containing a solute for the preparation of composite layers by pyrolysis of the solute on heated substrate (6) travelling in the muffle (2) of a furnace, characterized in that it comprises three parts, namely:

an injection chamber (36) provided in its upper part with at least one opening for the supply of aerosol and additional air and in its lower part with a plate (54) having holes, each of which is provided with a short tubular element (56) in the manner of a vertical chimney stack; a chamber (38) for the vaporization of the droplets of the aerosol provided with a double side wall containing heating resistors (62, 64, 66) distributed over its entire height in several groups, each regulatable in an autonomous manner;

a vapor phase discharge injector (40) in continuous form with the lower wall of the case and equipped with at least one slot (68) extending along a straight segment (70) in a direction perpendicular to the speed of travel of the substrate (6) to be coated.

6 Claims, 4 Drawing Sheets

AEROSOL INJECTION SYSTEM FOR PRODUCING COMPOSITE LAYERS BY PYROLYSIS

The present invention relates in general terms to installations and apparatuses making it possible to produce composite layers deposited on substrates. In such an installation, said substrates are heated and travel in the muffle of a furnace, where they are brought into the presence of a droplet aerosol containing a solute and which constitutes the precursor of the end product with which they are coated.

The invention more specifically relates to the system making it possible to inject said aerosol into the furnace in which are travelling the substrates to be coated.

In such known installations, the liquid droplet aerosol containing, as the solute, the precursor of the product to be deposited is formed and moved in a gaseous phase injected at the same time as the aerosol into the furnace and the two phenomena permitting the coating thereof occur when it reaches the immediate vicinity (e.g. a few millimeters) of the heated substrates. Firstly the droplets and the solute vaporize under the influence of heat and secondly the heat radiated by these substrates brings about the thermal decomposition or pyrolysis of the precursor solute, whereof the useful part for coating purposes then being directly deposited on the substrate.

This method consequently makes it possible to deposit products by the pyrolysis of a chemical compound dissolved in a solvent, even if the precursor solute of the deposition product has a too low vapour pressure to be directly vaporizable at ambient temperature.

This operating procedure which has made it possible to produce deposits of excellent quality is difficult to regulate and carry out for several reasons associated both with the principle and the conditions under which the pyrolysis takes place, as well as the difficulties inherent in the type of injector used in the hitherto developed industrial means.

BRIEF DESCRIPTION OF THE DRAWINGS

With reference to the attached FIGS. 1 and 2, a description will now be given of a known apparatus for performing the deposition process by pyrolysis from aerosols on heated substrates. The description of the known apparatus and its operation will give a better understanding of the specific deficiencies of the prior art, which the present invention aims at correcting.

FIG. 1 shows the furnace level with one of the aerosol injection devices 8 essentially constituted by a parallelepipedic case, which is fitted onto the muffle 2. The injection case 8 essentially contains an injection nozzle 10, which will be described in greater detail relative to FIG. 2 and, at its top, an inlet 12 for the additional air. Between the two, a plate 14 provided with holes makes it possible to homogenize and distribute the additional air entering by duct 12 into the entire volume of the injection case 8. The injector 10 receives at its ends 16 and 18 the aerosol to be injected into the case 8, said aerosol escaping into the injection case 8 by means of orifices 20 of the injector 10 located in the upper part of the latter. As has already been explained, the said aerosol contains in its liquid droplets a solute which is used as the precursor for the substance to be deposited on the heated substrates 6 and which will appear after the vaporization of said aerosol under the effect of the pyrolysis which occurs on contact between the hot substrates 6 and the aerosol vapour. Within the furnace muffle 2 are provided deflecting plates 22 used for homogenizing and regularizing the vapour phase flow rate in known manner and which need not be described in detail here.

FIG. 1 also shows a generally truncated cone-shaped suction nozzle 24, which makes it possible to regulate the overflow and suction rate of the residual vapour phase.

With regards to the principle of the method used, it is clear that the regulation of the parameters leading to a high quality deposition is relatively difficult, because the droplet aerosol is injected vertically above the furnace, i.e. it is in its last millimeters of travel where the two essential and successive operations of aerosol vaporization and pyrolysis of the thus vaporized solute take place. Moreover, it is the heat irradiated by the substrates in the zone 11 and only this from which are taken the vaporization energy and the pyrolysis energy, which leads to a significant cooling of the substrates at the very instant where the product to be deposited is in contact therewith.

In other words, the vaporization, the pyrolysis and the deposition take place in a very narrow zone exposed to complex heat exchanges, which makes it possible to carefully adjust the different parameters, particularly if it is wished to vary the travel speed of the substrates in the furnace or the gas injection flow rates for particular production requirements.

Figure 1:
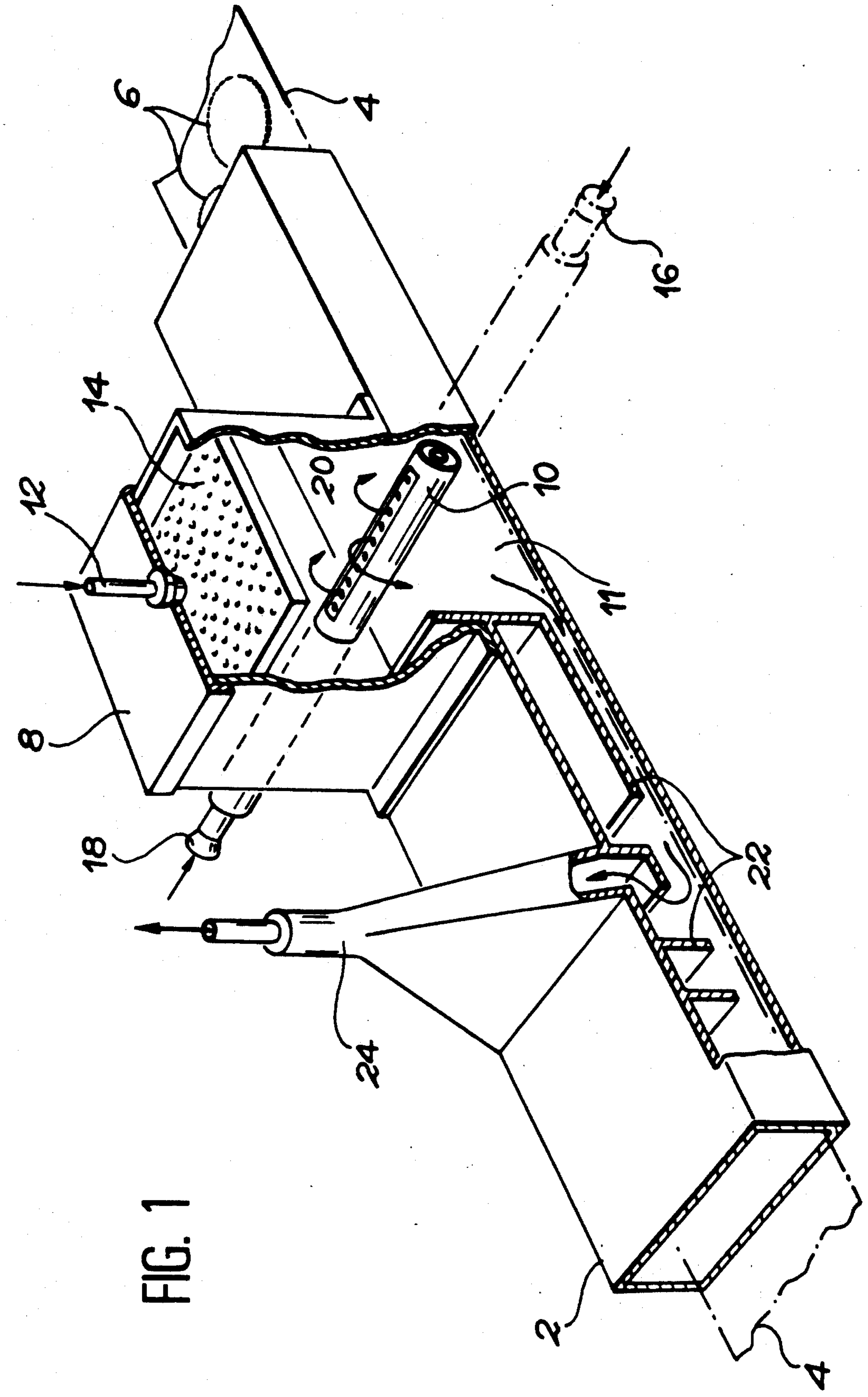
FIG. 1 is a perspective view of a pyrolysis furnace, whereof it is possible to see the elongated, parallelepipedic muffle 2, in which travels a conveyor belt 4 carrying the substrates 6 to be coated.

In the known apparatuses of the type described hereinbefore, the only heating source permitting the passage of the aerosol into the vapour state and the subsequent pyrolysis of the solute is the radiation of the actual furnace muffle, which leads to disadvantages if it is wished to operate with high industrial production rates without any loss of quality of the coating obtained. Thus, in a known system according to FIG. 1, after a certain number of hours of operation condensate droplets and then solid particles are observed on leaving the orifices 20 of the nozzle 10, particularly when a high production rate is sought. Thus, these solid particles are the consequence of condensates which inevitably occur on increasing the flow rates and which, having lost their solvent, concentrate and firstly pass into the pasty state and then into the solid state. These particles are entrained in a random manner in time, drop onto the substrates and thus lead to a deterioration of the coatings which it is wished to produce. After a certain time there is not infrequently an obstruction of a certain number of the injection orifices 20 of the nozzle 10, which clearly compromises the efficiency and quality of production. To this phenomenon is added another phenomenon due to the thermal variations of the nozzle during the restarting of the installation following a stoppage. When the temperature of the latter is not stabilized by the thermostatic liquid flowing in the enclosure 26, the aerosols and carrier gas give rise to solid deposits, which are entrained and also seriously compromise the quality of the deposits made on the substrates 6.

The aforementioned difficulties encountered in connection with the use of composite· layer production means using pyrolysis with the aid of the aforementioned equipment become particularly disadvantageous when it is wished to both increase the industrial production rates and maintain the quality of the coatings obtained and in particular their homogeneity, cleanness and appearance.

Thus, the aforementioned difficulties are due to the vaporization and pyrolysis conditions when the only heat source is the thermal radiation of the furnace, as well as the furnace injector which, under these conditions, leads to the production of undesirable solid particles.

The present invention specifically relates to a novel system for aerosol injection for producing composite layers by pyrolysis, which solves the aforementioned problems by adding to the same autonomous heating means and eliminating the injection nozzle.

The present invention therefore relates to a system for the injection of droplet aerosols travelling in a gaseous phase and containing a solute for the production of composite layers by the pyrolysis of the solute on heated substrates travelling in the muffle of a furnace, which has a generally parallelepipedic, vertical case, fitted by its base to the said muffle and supplied with aerosol and additional air at its top, said case being used for channelling the aerosol from its arrival at the top down to its base, where it reaches the various heated substrates, characterized in that said case has three parts, namely from top to bottom and on the common path of the aerosol and the gaseous phase:

an injection chamber provided in its upper part with at least one opening for the aerosol and additional air supply and, in its lower part, with a plate having holes, each of which is provided with a short tubular element in the manner of a vertical chimney stack issuing into the injection chamber, the different stacks ensuring the free passage of the aerosol and the additional air in the direction of the base of the case;

a chamber for vaporizing the aerosol droplets and provided with a double side wall containing heating resistors distributed over the entire height in several groups, each regulatable in an autonomous manner;

a vapour phase discharge injector continuous with the lower wall of the case and provided with at least one slot extending along a straight segment in a general direction perpendicular to the travel speed of the substrate to be coated, but whose opening is oriented in such a way as to ensure the passing onto the same of the vapour phase as parallel as possible to their surface.

This novel aerosol injection system consequently makes it possible to improve and very accurately control the development of the aerosol and the gaseous phase which is entrained from the top of the injection case to the base thereof by the various means associated therewith.

Firstly, the injection chamber located in its upper part serves as a condensation chamber in which the aerosols entrained by the carrier gas optionally become freed from their condensates which can occur, as a result of the plate provided with holes, whose different holes are provided with stacks, which only allow the passage of the aerosol when any condensates have been collected on the plate and discharged to the outside. Moreover, the aerosol passage surface both at the outlet from the supply openings and level with the different vertical stacks of the plate provided with holes leads to a distribution surface roughly ten times larger than in the case of the prior art nozzle, which reduces the gas passage speed by ensuring that they have a good distributional homogeneity, even at high flow rates.

The vaporization chamber, which has in its walls autonomous heating resistors in the form of several regulatable groups makes it possible to very easily and precisely check the heat gradient within the said chamber in the vertical direction and consequently makes it possible to bring about an overall check or control of the conditions of passage from the aerosol state into the vapour state. This arrangement avoids the undesired formation of various solid particles and also has the important advantage of not cooling the substrates travelling on the heating belt to the right of the injection system, because the aerosol vaporization heat is no longer taken from the thermal radiation of the actual substrates.

Finally, the vapour phase discharge injector e.g. makes it possible with the aid of a thermocouple to accurately determine the outlet or discharge temperature of the vapour phase and the gas, i.e. prepare the optimum pyrolysis conditions, which will take place in an area close to the heated substrates.

According to a particularly advantageous embodiment of the aerosol injection system according to the invention, the aerosol and additional air are introduced into the supply opening or openings of the injection chamber by two concentric ducts, whereof the central duct carries the aerosol and the peripheral annular duct the additional air. Obviously, as the diameter of the supply openings has nothing in common with that of the holes of the injection nozzle according to the prior art, it is possible to achieve much more fabourable injection conditions.

In a preferred manner, the injection chamber has two supply openings located with a transverse displacement on two facing side walls. This arrangement leads to a better distribution of the gas flows in the injection chamber, whilst preventing any prejudicial turbulence, which would occur if the two supply openings were facing one another on two opposite side walls.

The number of independent heating resistor groups provided in the walls of the vaporization chamber can clearly vary at random, but experience has shown that three groups of independently regulatable resistors make it possible to adequately accurately check the temperature gradient of the injection of the vapour phase.

Finally, the discharge injector of the aerosol injection system according to the invention can have one or more unidirectional discharge slots. When there are two such slots, they are symmetrical with respect to the case and one is directed in the belt travel direction and the other in the opposite direction.

Figure 3:
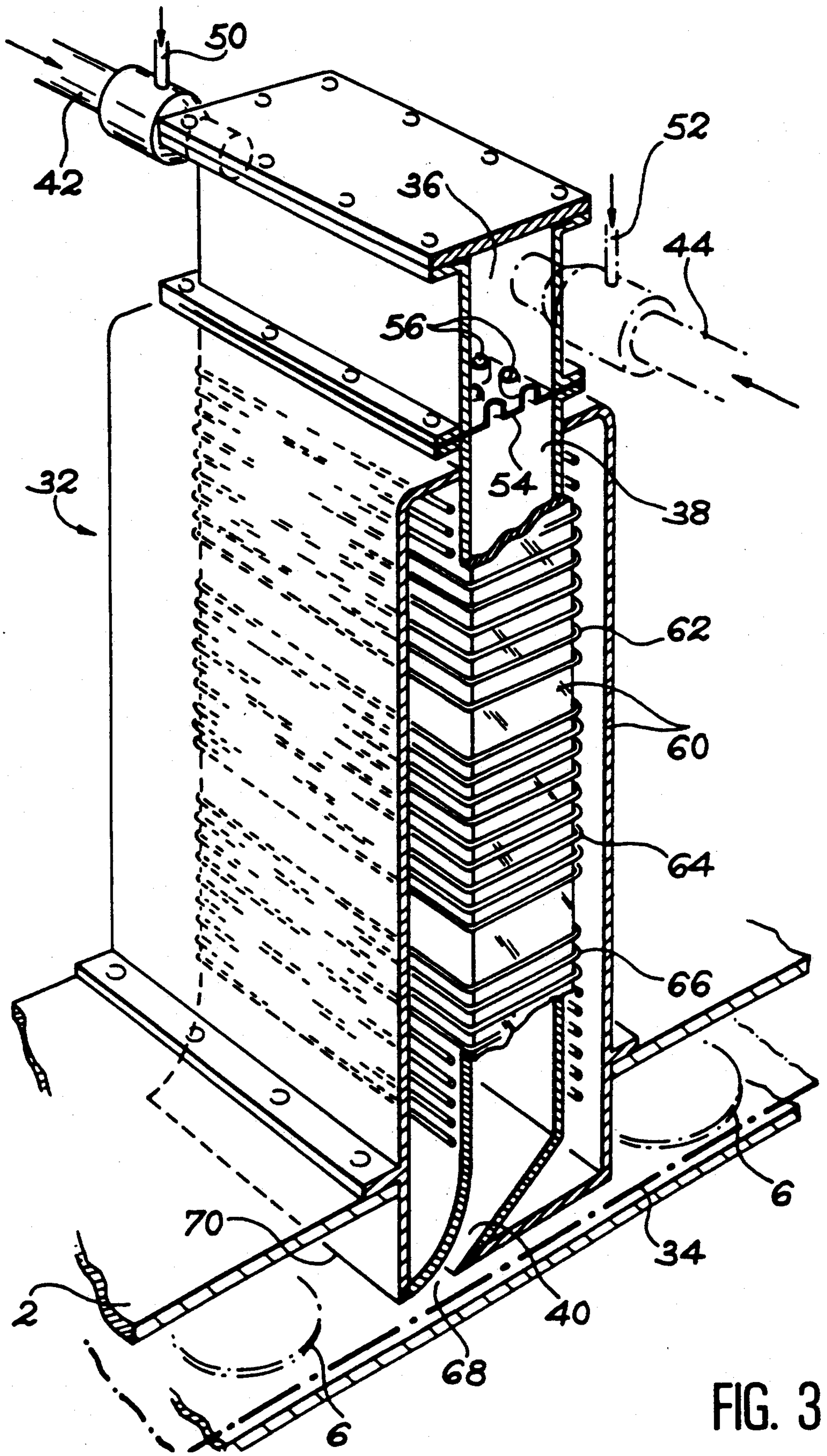

The invention is described in greater detail hereinafter relative to non-limitative embodiments and the attached FIGS. 3 to 5, wherein show:

FIG. 3 An elevation view, with partly broken away case front, of an aerosol injection system according to the invention.

Figure 4:
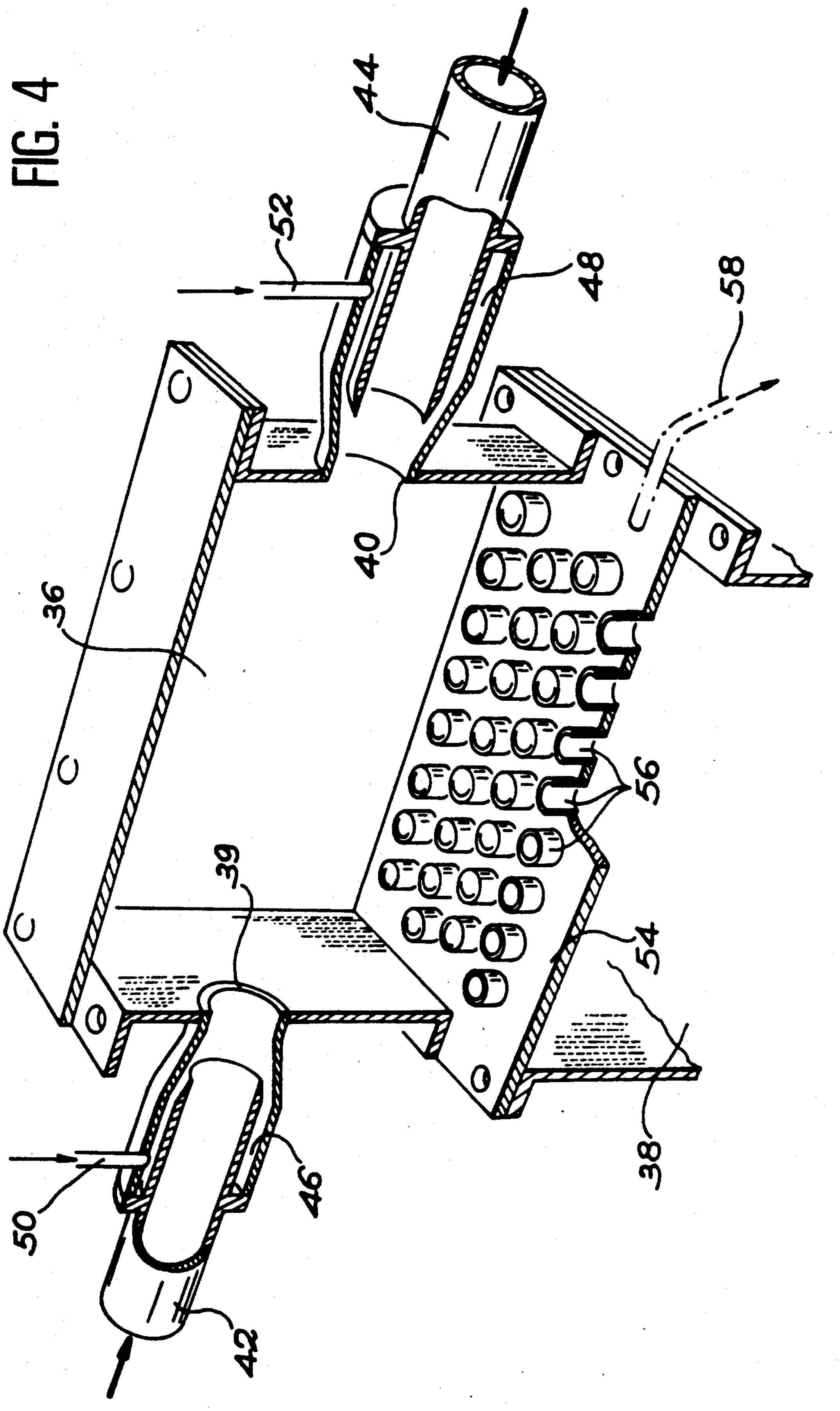

FIG. 4 An exploded perspective view of the injection chamber of the aerosol injection system according to the invention.

Figures 2, 5:
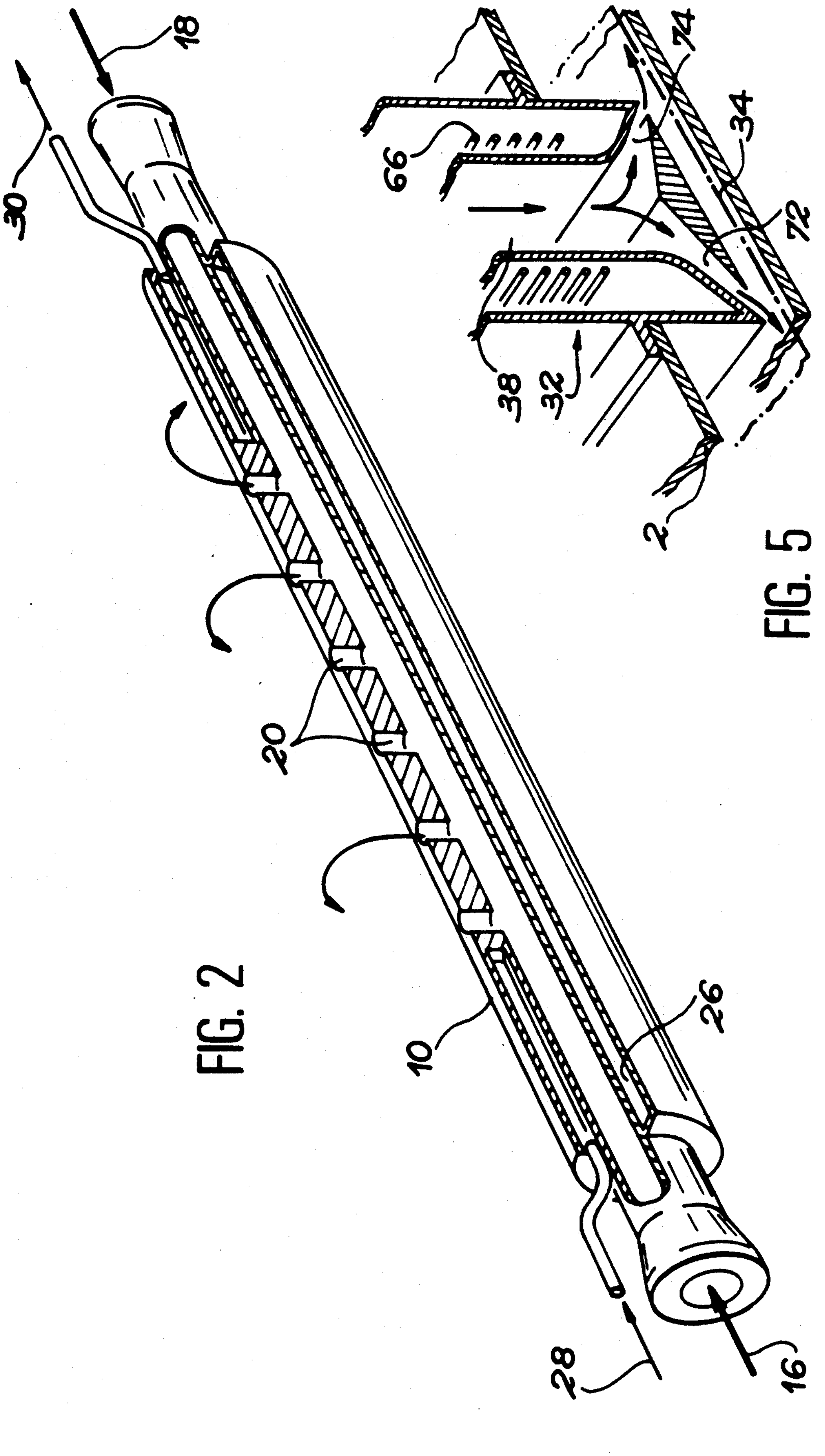
FIG. 2 shows the injection nozzle 10 of FIG. 1 with its two inlets 16 and 18 for the aerosol entrained by its vector gas, as well as an annular envelope 26 for receiving a thermostatic liquid, which enters at one end 28 into said chamber 26 and passes out from the other end 30. On said injection nozzle are provided the orifices 20, which are located in the upper part and by which escape in accordance with the paths indicated by the arrows the aerosol entrained by its vector gas. The operating temperature of the nozzle 10 is usually regulated by the liquid circulating in the peripheral annular zone 26 at approximately 50° to 60° C.

FIG. 5 A variant of the discharge injector of the injection system of FIG. 3, in which said injector has two symmetrical unidirectional slots on either side of the case axis.

FIG. 3 shows an aerosol injection system 32 according to the invention. Like those of the prior art, this aerosol injection system is fixed to the upper part of the muffle 2 of a heating furnace in which travels a conveyor belt 34 containing samples 6 in the form of the substrate to be coated.

According to the invention, the injection system 32 is essentially provided from top to bottom with three parts, namely in the upper part an injection chamber 36 followed on the common path of the aerosol and the gaseous phase by a vaporization chamber 38 and an outlet or discharge injector 40. The injection system 32 for the aerosol, like that of the prior art, serves to bring the aerosol, its vector gas and the additional air to the immediate vicinity of the substrates 6 to be coated by the pyrolysis of a precursor solute of the product to be deposited on the substrate 6.

Firstly a description will be given of the injection chamber 36 with reference to FIG. 4, where it is shown in greater detail. The injection chamber is provided in its upper part with two aerosol supply openings 39 and 40 connected to two tubes 42, 44 for supplying the aerosol moved by its vector gas. According to a preferred feature of the invention, the axes of the tubes 42, 44 are transversely displaced and the two gaseous jets enter the injection chamber 36 without being in direct contact. In the example described, the injection of the additional air necessary for the transfer of the gaseous phase and/or the reaction takes place in accordance with the annular zones 46 and 48 of the intake tubes 42, 44, said zones 46, 48 being supplied in each case by an intake tube 50, 52 respectively for the additional air.

According to the invention, the lower part of the injection chamber 36 is terminated by a plate 54 having a certain number of holes, each of which is provided with a short tubular element such as 56, which issues in the manner of a vertical chimney stack into the upper part of the injection chamber 36. These stacks 56 constitute free passages for the aerosol and the gaseous phase to the vaporization chamber 38 located immediately below. The plate 54 also serves to collect all undesired condensation products, which can form from the gaseous phase and which flow on the walls of the chamber 36 and then on the surface of the plate 54, being finally discharged to the outside by a discharging tube 58, thus preventing their passage into the vaporization chamber 38. This particular construction of the perforated plate 54 of the injection chamber 36 already eliminates a significant part of the difficulties occurring in the prior art connected with the possible arrival of undesired condensates on the substrates to be coated. It should be noted that this elimination of condensates is perfectly compatible, due to the number of stacks of the plate 54 and the diameter dimensions thereof, with a high gas flow rate, e.g. ten times higher than that which could not be exceeded with the prior art means without prejudicing the quality of the deposits obtained.

On returning now to FIG. 3, a more detailed description will be given of the vaporization chamber 38, which follows the injection chamber 36 on the path of the aerosols and the vapour phase. According to the invention, said vaporization chamber 38 is provided with a double wall 60 containing a certain number of groups, in this case three of heating resistors 62, 64, 66 covers its entire height. Each of these groups is supplied and regulated in an autonomous manner. This is one of the essential means of the invention by which it is possible to regulate and optimize as a function of the solvent or flow rates used, the discharge temperature of the vapour phase at the following discharge injector 40. With the aid of these three thermal settings on several independent zones, it is possible to accept for the same flow rate an aerosol speed increased by a factor of 10, e.g. compared with that which it was possible to accept with the prior art injectors, simply as a result of the fact that mastery has been obtained of the parameters making it possible to bring about a regular, repeated flow, thereby preventing the formation of possible undesired solid phases as a result of stagnation in certain zones. In other words, on leaving the vaporization chamber 38, i.e. on entering the injector 40, the products are entirely int he gaseous and vapour phase and at the desired temperature for enabling the following pyrolysis to take place under optimum conditions. It should be noted that this result is obtained through the heat supplied by the heating resistors 62, 64 and 66, i.e. without any radiated heat from the substrate 6 travelling on the conveyor belt 34.

Finally, the lower part of the injection system according to the invention and constituted by the vapour phase discharge injector 40, is in the form of a slot 68 extending in accordance with a straight segment 70 generally directed perpendicular to the flow rate of the substrates 6 on the belt 34. The opening of the said slot 68 is oriented in such a way as to ensure the travelling of the vapour phase as parallel as possible to the belt 34 and to the surface of the moving substrates 6. The pyrolysis and deposition operation takes place in the immediate vicinity of the surface of these hot substrates. As the vapour phase produced in the vaporization chamber 38 is free from any liquid or solid impurities, the deposition operations are carried out under excellent cleanness and homogeneity conditions.

On referring to FIG. 5, it is possible to see the same elements as in FIG. 4. A description will be given of a variant of the vapour phase discharge injector, in which the latter has two unidirectional discharge slots 72, 74, which are oriented symmetrically with respect to the vertical axis of the injector case, but one of them 72 is directed in the travel direction of the belt 34 and the other 74 in the opposite direction. In each particular case and as a function of the result to be achieved, the Expert can choose which of the two aforementioned discharge injectors is the most appropriate.

The bidirectional injector system makes it possible to quadruple the quantities deposited on the surface and the presence of a not shown extraction means on either side of this injection system permits a much more favourable arrangement for the gaseous outflows within the injection system.

In general terms and contrary to what was the case with the prior art injection cases, there is a true proportionality between the gas flow rate and the coating quantity deposited on the substrates. By doubling the gas flow rate, there is a doubling of the deposited product quantity, which was not possible with the prior art injection system.

I claim:

1. System for the injection of droplet aerosols travelling in a gaseous phase and containing a solute for the production of composite layers by the pyrolysis of the solute on heated substrates (6) travelling in the muffle (2) of a furnace, which has a generally parallelepipedic, vertical case (8), fitted by its base to the said muffle and supplied with aerosol and additional air at its top, said case being used for channelling the aerosol from its arrival at the top down to its base, where it reaches the various heated substrates, characterized in that said case has three parts, namely from top to bottom and on the common path of the aerosol and the gaseous phase: an injection chamber (36) provided in its upper part with at least one opening for the aerosol and additional air supply and, in its lower part, with a plate (54) having holes, each of which is provided with a short tubular element (56) in the manner of a vertical chimney stack issuing into the injection chamber, the different stacks (56) ensuring the free passage of the aerosol and the additional air in the direction of the base of the case;

a chamber (38) for vaporizing the aerosol droplets and provided with a double side wall containing heating resistors (62, 64, 66) distributed over the entire height in several groups, each regulatable in an autonomous manner;

a vapour phase discharge injector (40) continuous with the lower wall of the case and provided with at least one slot (68) extending along a straight segment (70) in a general direction perpendicular to the travel speed of the substrate (6) to be coated, but whose opening is oriented in such a way as to ensure the passing onto the same of the vapour phase as parallel as possible to their surface.

2. Aerosol injection system according to claim 1, characterized in that the aerosol and the additional air are introduced into the supply opening or openings of the injection chamber by two concentric ducts, whereof the central duct (42, 44) carries the aerosol and the peripheral annular duct (46, 48) the additional air.

3. Aerosol injection system according to either of the claims 1 and 2, characterized in that the injection chamber is provided with two supply openings (39, 40), which are positioned in a displaced manner on the two facing side walls.

4. Aerosol injection system according to claim 1, characterized in that the vaporization chamber has three groups of resistors, each of which is independently regulatable.

5. Aerosol injection system according to claim 1, characterized in that the discharge injector has a unidirectional discharge slot (68).

6. Aerosol injection system according to claim 1, characterized in that the discharge injector has two unidirectional discharge slots (72, 74) positioned symmetrically with respect to the case, one being directed in the travel direction of the belt and the other in the opposite direction.

* * * * *